(12) United States Patent
Aisenbrey

(10) Patent No.: US 7,027,304 B2
(45) Date of Patent: Apr. 11, 2006

(54) LOW COST THERMAL MANAGEMENT DEVICE OR HEAT SINK MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 0 days.

(21) Appl. No.: 10/807,036

(22) Filed: Mar. 23, 2004

(65) Prior Publication Data

US 2004/0174651 A1  Sep. 9, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/478,775, filed on Jun. 16, 2003, provisional application No. 60/462,072, filed on Apr. 14, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H05K 7/20* (2006.01)

(52) U.S. Cl. ............ 361/704; 361/700; 361/708; 361/709; 165/80.4; 165/104.33; 165/185

(58) Field of Classification Search ........ 361/704–709, 361/700; 257/706, 712, 714, 715; 165/80.3, 165/80.4; 428/210, 313.5
See application file for complete search history.

(56) References Cited

U.S. PATENT DOCUMENTS

| | | | | |
|---|---|---|---|---|
| 3,936,686 A | * | 2/1976 | Moore | 313/36 |
| 4,838,346 A | * | 6/1989 | Camarda et al. | 165/104.14 |
| 5,060,114 A | * | 10/1991 | Feinberg et al. | 361/706 |

(Continued)

FOREIGN PATENT DOCUMENTS

EP  0506509 A  3/1992

(Continued)

OTHER PUBLICATIONS

U.S. Appl. No. 10/309,429, filed Dec. 4, 2002, assigned to the same assignee, "Low Cost Antennas Using Conductive Plastics or Conductive Composites".

*Primary Examiner*—Boris Chervinsky
(74) *Attorney, Agent, or Firm*—Douglas R. Schnabel

(57) ABSTRACT

Heat sinks, heat pipes, and other thermal management devices are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

53 Claims, 10 Drawing Sheets

U.S. PATENT DOCUMENTS

| | | | |
|---|---|---|---|
| 5,296,740 A * | 3/1994 | Sono et al. | 257/706 |
| 5,371,404 A * | 12/1994 | Juskey et al. | 257/659 |
| 5,649,593 A * | 7/1997 | Yamaguchi et al. | 165/185 |
| 5,738,936 A * | 4/1998 | Hanrahan | 428/313.5 |
| 5,781,412 A * | 7/1998 | de Sorgo | 361/704 |
| 5,849,130 A | 12/1998 | Browne | 156/256 |
| 5,857,767 A | 1/1999 | Hochstein | 362/294 |
| 5,986,885 A * | 11/1999 | Wyland | 361/704 |
| 6,082,443 A * | 7/2000 | Yamamoto et al. | 165/104.26 |
| 6,107,216 A * | 8/2000 | Kennedy et al. | 442/19 |
| 6,284,817 B1 | 9/2001 | Cross et al. | 523/220 |
| 6,364,009 B1 | 4/2002 | MacManus et al. | 165/185 |
| 6,397,941 B1 | 6/2002 | McCullough | 165/185 |
| 6,451,418 B1 | 9/2002 | Tobita | 428/297.4 |
| 6,565,772 B1 | 5/2003 | Schneck | 252/511 |
| 6,597,063 B1 | 7/2003 | Shimizu et al. | 257/687 |
| 6,753,093 B1 * | 6/2004 | Tanaka et al. | 428/615 |
| 6,822,018 B1 * | 11/2004 | Chaudhuri et al. | 523/210 |
| 6,914,025 B1 * | 7/2005 | Ekstrom et al. | 501/90 |
| 6,919,504 B1 * | 7/2005 | McCutcheon et al. | 174/16.3 |
| 2001/0050441 A1 | 12/2001 | Shivkumar et al. | 257/778 |
| 2002/0072137 A1 | 6/2002 | Ih | 438/22 |
| 2002/0109634 A1 | 8/2002 | Aisenbrey | 343/700 MS |
| 2002/0175621 A1 | 11/2002 | Song et al. | 313/515 |
| 2003/0102117 A1 * | 6/2003 | Murayama et al. | 165/185 |
| 2003/0183379 A1 | 10/2003 | Krassowski et al. | 165/185 |
| 2004/0028875 A1 * | 2/2004 | Van Rijn et al. | 428/98 |
| 2004/0151885 A1 * | 8/2004 | Jayaraman et al. | 428/210 |
| 2004/0264195 A1 * | 12/2004 | Chang et al. | 362/294 |

FOREIGN PATENT DOCUMENTS

| | | |
|---|---|---|
| EP | 0506509 A2 | 3/1992 |
| EP | 1265281 A | 6/2002 |
| EP | 1265281 A2 | 6/2002 |
| GB | 2377449 A | 1/2003 |
| WO | WO 95/09444 A | 9/1994 |
| WO | WO 03/017365 A | 8/2001 |
| WO | WO 03/017365 A2 | 8/2001 |

* cited by examiner

LOW COST THERMAL MANAGEMENT DEVICE OR HEAT SINK MANUFACTURED FROM CONDUCTIVE LOADED RESIN-BASED MATERIALS

This Patent Application claims priority to the U.S. Provisional Patent Application 60/462,072, filed on Apr. 14, 2003 and to the U.S. Provisional Patent Application 60/478,775, filed on Jun. 16, 2003 which are herein incorporatod by reference in their entirety.

This Patent Application is a Continuation-in-Part of INT01-002CIP, filed as U.S. patent application Ser. No. 10/309,429, filed on Dec. 4, 2002, now issued as U.S. Pat. No. 6,870,516, also incorporated by reference in its entirety, which is a Continuation-in-Part application of docket number INT01-002, filed as U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to thermal management structures and, more particularly, to heat sinks and related thermal dissipation devices molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Modern electronic systems create many thermal management problems. For example, integrated circuits operating at very high switching speeds generate a large amount of heat due to IR losses. This heat must be efficiently removed from the integrated circuit device to maintain high-speed performance and to prevent a device failure. In addition, high current switches generate a large amount of heat loss due to IR that must be dissipated from the device to avoid a failure. Power oriented circuits, such as DC-DC converters, power supply circuits, etc., also generate significant heat that must be dissipated to protect the power devices.

A typical approach to removing heat from an integrated circuit, switching transistor, or power-oriented circuit is the use of a heat sink. A heat sink is a structure that is attached to a heat-producing device such that thermal energy is conducted out from the heat producer and into the heat sink. Further, the heat sink dissipates this thermal energy at a rate sufficient to maintain thermal energy flow from the heat-producing device into the heat sink. As a result, the heat sink maintains the temperature of the device at a level that will prevent reduced performance or catastrophic failure. Typical heat sinks are formed from metal. For example, aluminum is frequently used as a heat sink material due to the excellent thermal conductivity and relatively low weight of this metal. The typical heat sink is attached, for example, to a metal tap on the IC or transistor device to achieve a good thermal path between device and heat sink. Further, the heat sink structure typically is constructed to have a large surface area by, for example, using a large number of parallel fins such that the heat sink presents a large surface for removing heat by convection.

Another type of thermal management device is a heat pipe. A heat pipe is a pipe containing a small amount of liquid. Heat from a heat source, such as an electronic device, causes the liquid to vaporize. As this liquid vaporizes, the liquid absorbs the latent heat of vaporization from the heat source. The vapor travels away from the heat source, through the pipe, to the cool end of the pipe. At the cool end of the pipe, the vapor condenses to liquid to complete the heat transfer. Typical heat pipes are constructed of metal and may further contain a lining of wicking material. Heat pipes are often coupled with heat sinks to form a heat transfer system where the heat pipe conducts heat away from the heat source and where a heat sink structure is used to enhance thermal transfer at the condensing end of the heat pipe.

The present practice of forming heat sink or heat pipe structures from metal has several disadvantages. Among these disadvantages are the material and manufacturing cost of metal, especially copper, and the weight of the metal. Reduction of system cost and weight by changing the composition of the heat sink and/or heat pipe is therefore a key objective of the present invention.

Several prior art inventions relate to conductive resin compositions and structures. U.S. Pat. No. 6,565,772 to Schneck teaches a conductive resin comprising resin, a cure accelerant, and a conductive particulate. The conductive resin is applied to hide welding imperfections in automobile manufacturing. U.S. Pat. No. 6,451,418 to Tobita describes a substrate or a chip package constructed from a heat conductive resin material. The heat conductive resin material comprises polybenzasol fibers oriented in the thick direction of the substrate. U.S. Pat. No. 6,284,817 to Cross et al discloses a conductive resin-based material including aluminum oxide and zinc oxide particles. The material is used in one embodiment to bond a packaged transistor to an aluminum heat sink. U.S. Pat. No. 6,597,063 to Shimizu et al shows a package for a semiconductor power device. A high heat conductive resin is formed between the power device and the heat sink in one embodiment. U.S. Patent Application 2003/0183379 to Krassowski et al teaches a composite heat sink comprising a graphite base and conductive plastic fins. The conductive plastic comprises graphite flakes in a resin base.

SUMMARY OF THE INVENTION

A principal object of the present invention is to provide an effective heat dissipation device.

A further object of the present invention is to provide a method to form a heat dissipation device.

A further object of the present invention is to provide a heat sink or heat pipe molded of conductive loaded resin-based materials.

A yet further object of the present invention is to provide a heat sink or heat pipe molded of conductive loaded resin-based materials where the thermal characteristics of the heat sink or heat pipe can be adjusted by altering the composition of the conductive loaded resin-based materials.

A yet further object of the present invention is to provide a heat sink or heat pipe molded of conductive loaded resin-based material where the thermal characteristics can be altered or the visual characteristics can be altered by forming a metal layer over the conductive loaded resin-based material.

A yet further object of the present invention is to provide methods to fabricate a heat sink or heat pipe from a conductive loaded resin-based material incorporating various forms of the material.

A yet further object of the present invention is to provide a method to fabricate a heat sink or heat pipe from a conductive loaded resin-based material where the material is in the form of a fabric.

In accordance with the objects of this invention, a thermal dissipation device is achieved. The device comprises a bulk region, an attachment surface on a first side of the bulk region, and a convection surface on a second side of the bulk region. The bulk region, attachment surface, and convection surface comprise a conductive loaded, resin-based material further comprising conductive materials in a resin host.

Also in accordance with the objects of this invention, a heat pipe device is achieved. The heat pipe device comprises a conduit comprising a conductive loaded, resin-based material comprising conductive materials in a resin host. A vaporizable liquid is sealed inside the heat pipe by the conduit.

Also in accordance with the objects of this invention, an electrical system device is achieved. The device comprises an electrically powered device, and a thermal dissipation device. The thermal dissipation device comprises a conductive loaded, resin-based material comprising conductive materials in a resin host.

Also in accordance with the objects of this invention, a method to form a thermal dissipation device is achieved. The method comprises providing a conductive loaded, resin-based material comprising conductive materials in a resin-based host. The conductive loaded, resin-based material are molded into the thermal dissipation device.

Also in accordance with the objects of this invention, a combined light and heat sink device is achieved. The device comprises a light, a first terminal connected to the light, a second terminal connected to the light, and a heat sink. The first and second terminals and the heat sink comprise a conductive loaded resin-based material.

BRIEF DESCRIPTION OF THE DRAWINGS

In the accompanying drawings forming a material part of this description, there is shown:

FIG. 1a illustrates a heat sink comprising a series of parallel fins. FIG. 1b illustrates a pin heat sink comprising an array of pins or shafts.

DESCRIPTION OF THE PREFERRED EMBODIMENTS

Figure 1A:
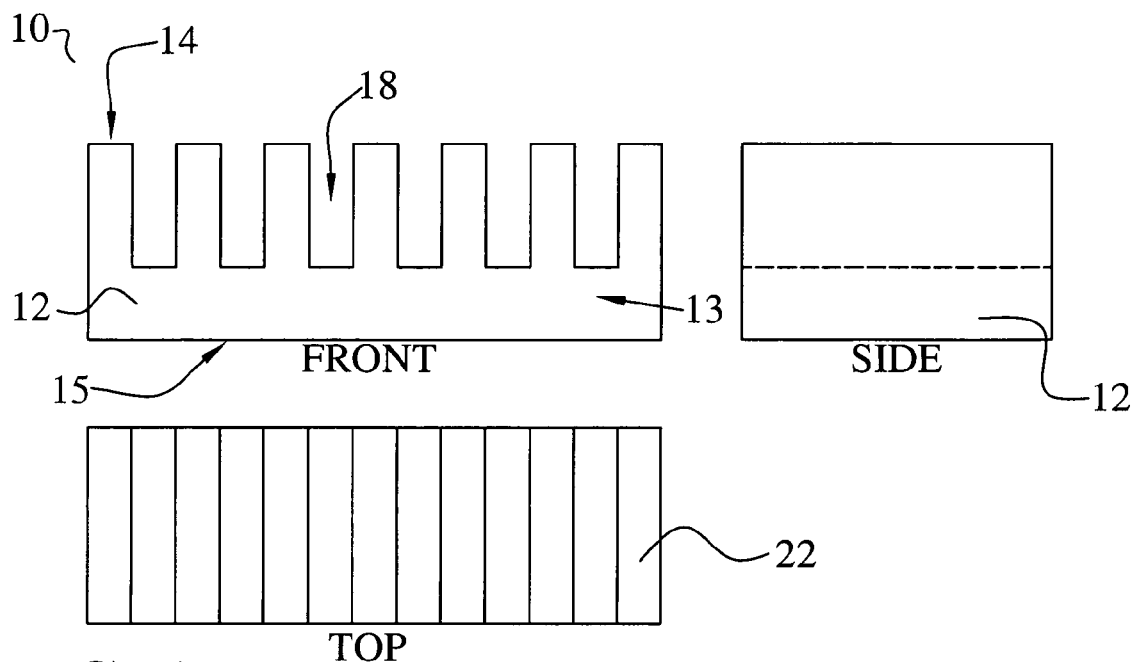
FIGS. 1a and 1b illustrate a first preferred embodiment of the present invention showing a heat sink or thermal management device comprising a conductive resin-based material.

This invention relates to heat sinks and to other thermal management devices molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal conductivity characteristics of heat sinks or other thermal management devices fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the heat sinks or other thermal management devices are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of heat dissipation devices significantly lowers the cost of materials and the design and manufacturing processes used to hold ease of close tolerances, by forming these materials into desired shapes and sizes. The heat sinks or other thermal management devices can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or in any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the heat dissipation device, and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming heat sinks or other thermal management devices that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

Figure 1B:
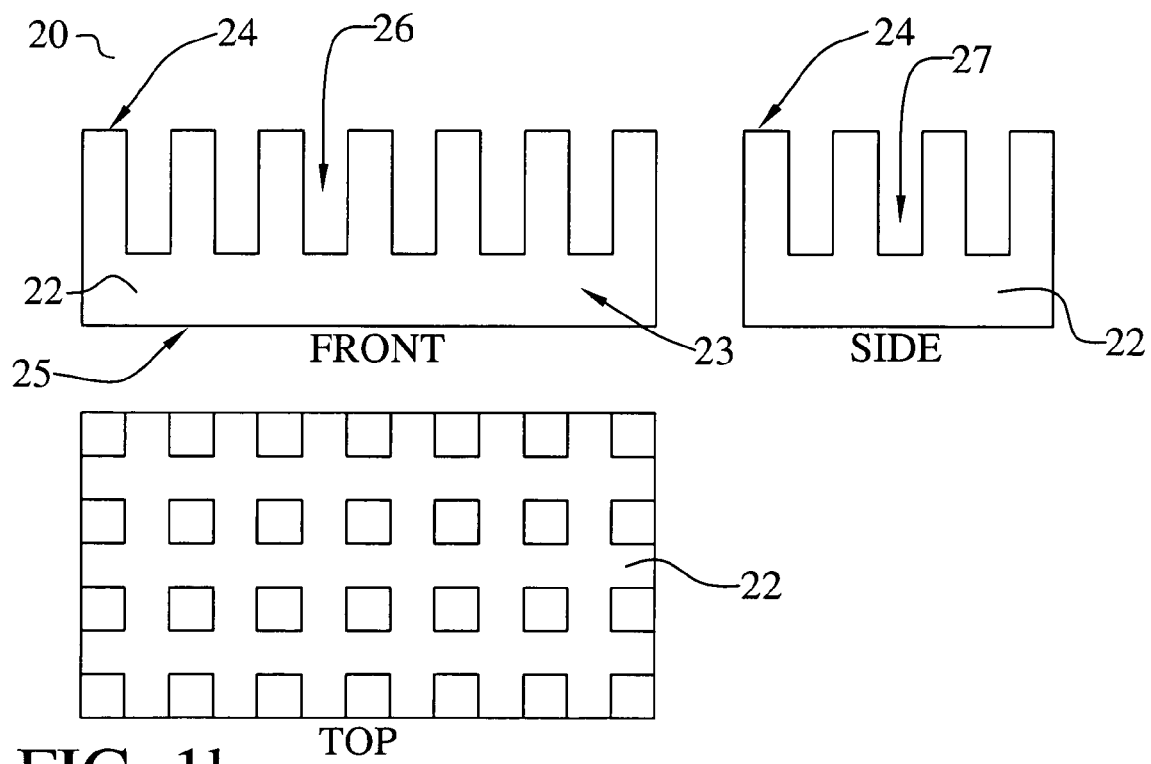

Referring now to FIGS. 1a and 1b, a first preferred embodiment of the present invention is illustrated. Several important features of the present invention are shown and discussed below. Referring now to FIG. 1a, this embodiment 10 of the present invention shows a heat sink 12 or thermal management device comprising a conductive loaded resin-based material. The heat sink device 12 comprises a bulk region 13, an attachment surface 15 on a first side of the bulk region, and a convection surface 14 on a second side of the bulk region. The bulk region 13, attachment surface 15, and convection surface 14 are each formed from the conductive loaded, resin-based material. In this heat sink example, a series of parallel fins 14, separated by gaps 18, are used to provide a convection surface to transfer heat out from the heat sink 12. The attachment surface 15 has a flat topology to provide an optimal contact area to a heat-producing device. However, due to the moldability of the conductive loaded resin-based material, any topology may be formed for the attachment surface 15. Intervening layers, mechanical devices, or thermally conductive adhesives may be used to bond together the attachment surface 15 of the heat sink 12 and the heat-producing device. The bulk region 13 of the heat sink 12 provides a thermal mass to temporarily store thermal energy that is transferred from the heat-producing device into the heat sink 12. The convective surface 14 and 18 is preferably is oriented away from the heat producing device. The convective surface 14 and 18 preferably comprises a surface topology that will efficiently release thermal energy to the surrounding air or fluid. Preferably, the convective surface 26 comprises fins, as shown, to increase the surface area for heat transfer by convection.

Referring now to FIG. 1b, another heat sink 22 is illustrated. In this case, an array of pins 24 or shafts, separated by gaps 26, are formed as the convection surface of the heat sink 22. The attachment side 25, bulk region 23, and convection surface 24 again are molded of a conductive loaded resin-based material. The heat sink devices 12 and 22 can be fabricated at a very low cost. The fins 14 and 24 provide large convection surface areas compared to the limited attachment surfaces 15 and 25 that are attached to the thermal generating source.

Figure 7:
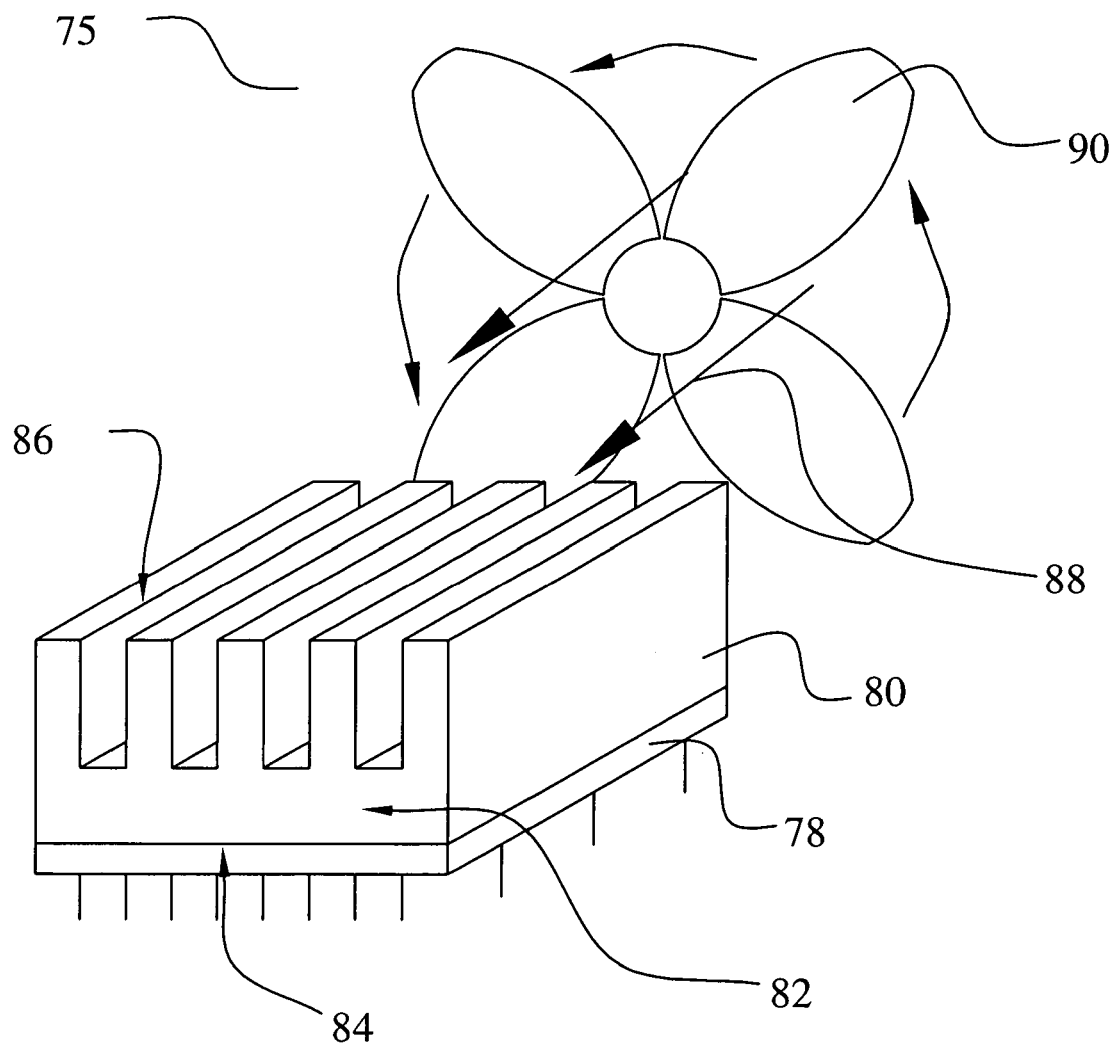
FIG. 7 illustrates an electronic system incorporating the conductive loaded resin-based heat sink.
Figure 8:
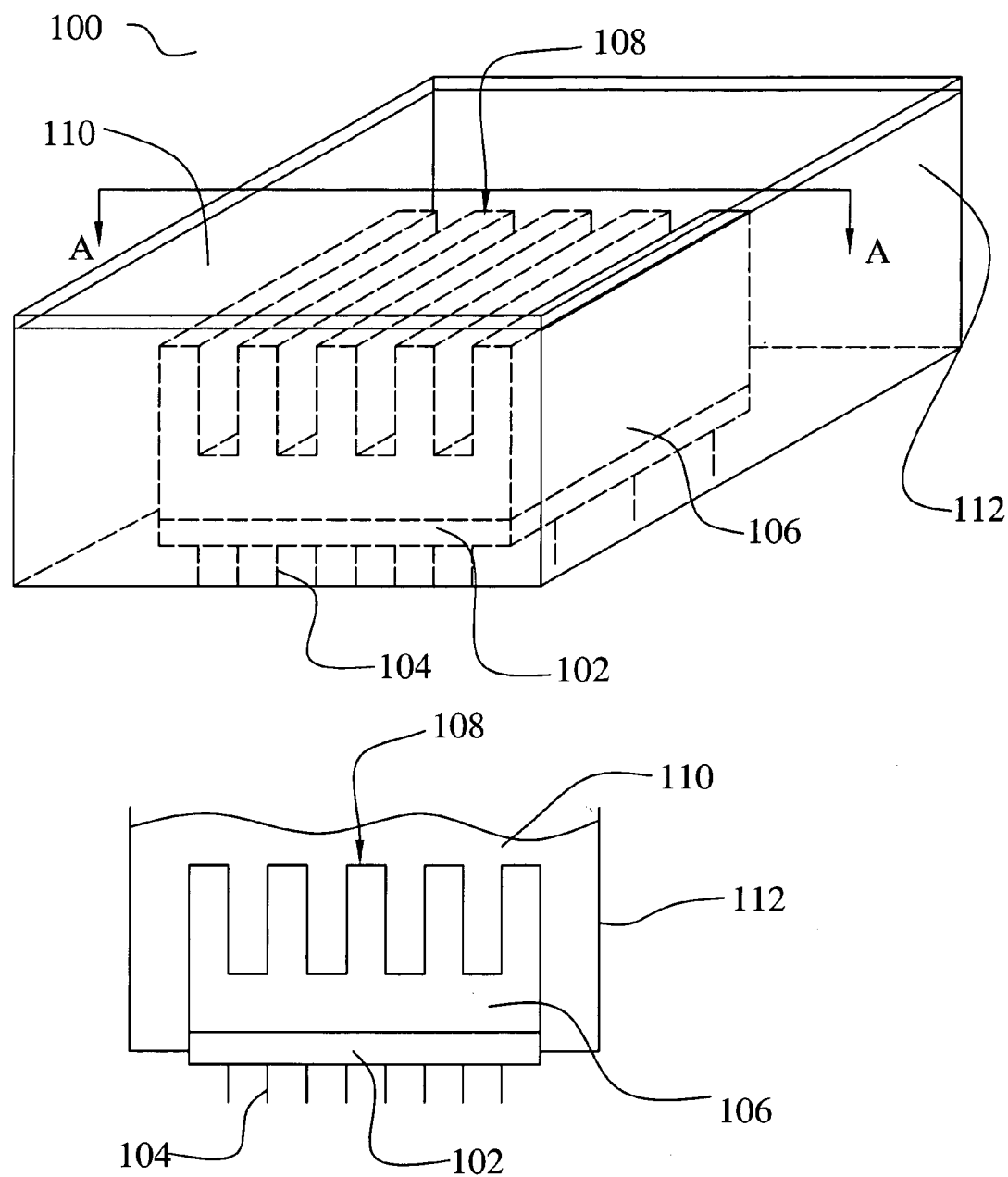
FIG. 8 illustrates an electronic system incorporating the conductive loaded resin-based heat sink with a liquid cooling mechanism.

Referring now to FIG. 7, an exemplary heat sink arrangement is shown. The heat sink 80 is attached to an integrated circuit 78 such that the integrated circuit 78 and the attachment surface 84 of the heat sink are in thermal contact. Intervening layers, mechanical devices, or thermally conductive adhesives may be used to bond together the heat sink 80 and the heat-producing device 78. The bulk region 82 of the heat sink 80 provides a thermal mass to temporarily store thermal energy that is transferred from a heat-producing device. The thermal energy stored in the heat sink 80 is then released into the surrounding ambient by the convective surface 86. The module conductivity between the thermal generating device 78 and the heat sink 80 thereby allows thermal energy, as heat, to be conducted from the integrated circuit or module 78, into the heat sink 80, and then into the surrounding ambient. In FIG. 7, the embodiment uses air 88 as the ambient. This approach is further enhanced by adding a fan 90 to force air 88 over the convective surface 86 and to thereby increase the thermal transfer rate. Referring now to FIG. 8, air may be replaced with a liquid 110, such as chilled water, in a liquid cooled system 100. In this case, the liquid 110 is contained by a structure 112 that allows the convective surface 108 of the heat sink to receive optimal exposure to the liquid 110. The thermal generating device 102 may be shielded from direct contact with the liquid 110 by the containing structure 112. The conductive loaded, resin-based heat sink is impervious to moisture. Therefore, the heat sink 106 and 108 can be exposed to external environments like the cooling liquid 110.

The heat sink devices 12 and 22, as shown in FIGS. 1a and 1b, are fabricated of the conductor loaded, resin-based material, exhibits excellent thermal conductivity as well. The presence of the conductive materials homogenized within the base resin increases the thermal conductivity to a level sufficient for a heat dissipation structure. In addition, the conductor loaded, resin-based material provides sufficient structural stability for a reliable heat dissipation device that will perform over a large number of thermal cycles. Further, the heat sink can be tailored to the expected environmental characteristics depending on the type of base resin selected.

Figure 2:
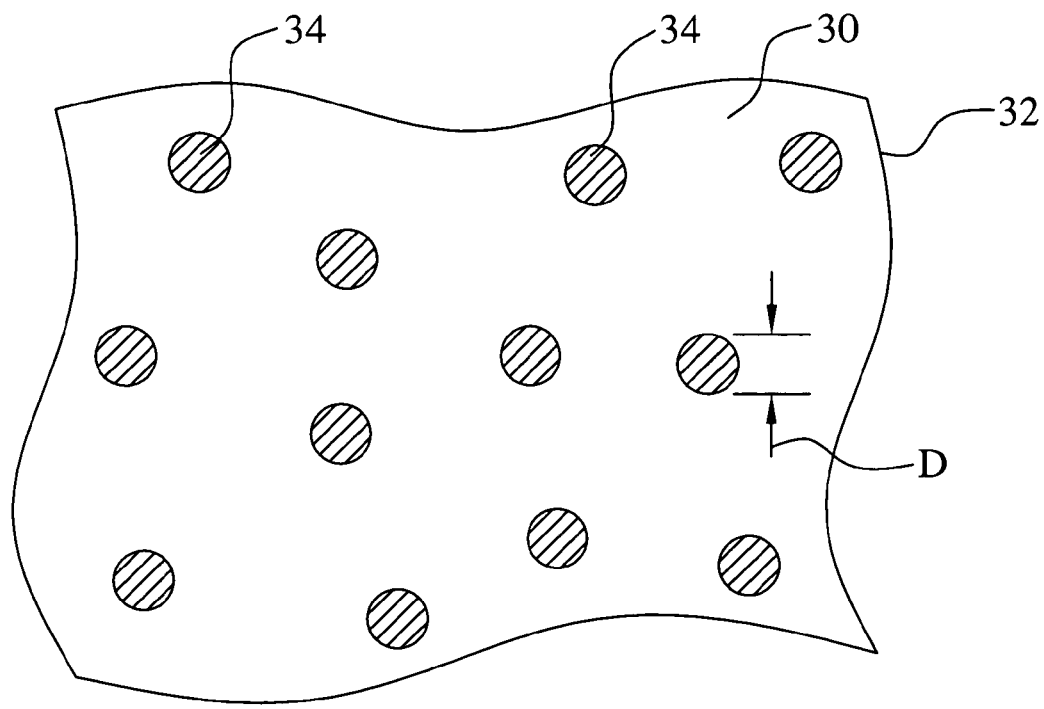
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
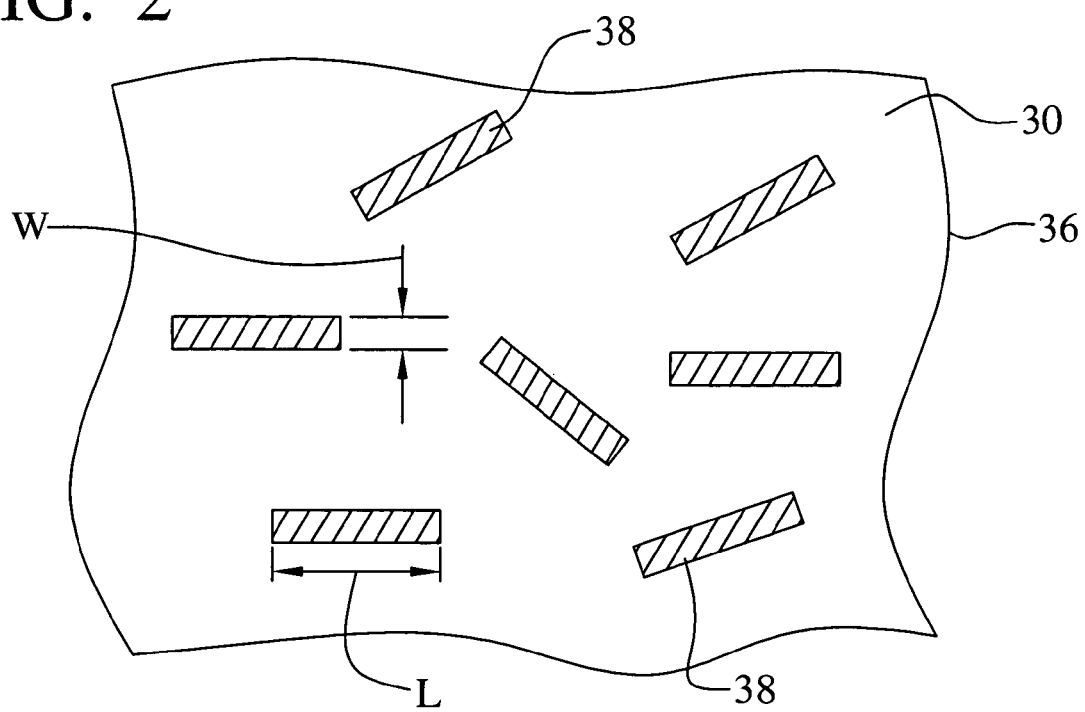
FIG. 3 illustrates a second preferred embodiment of a conductive loaded resin-based material wherein the conductive materials comprise micron conductive fibers.
Figure 4:
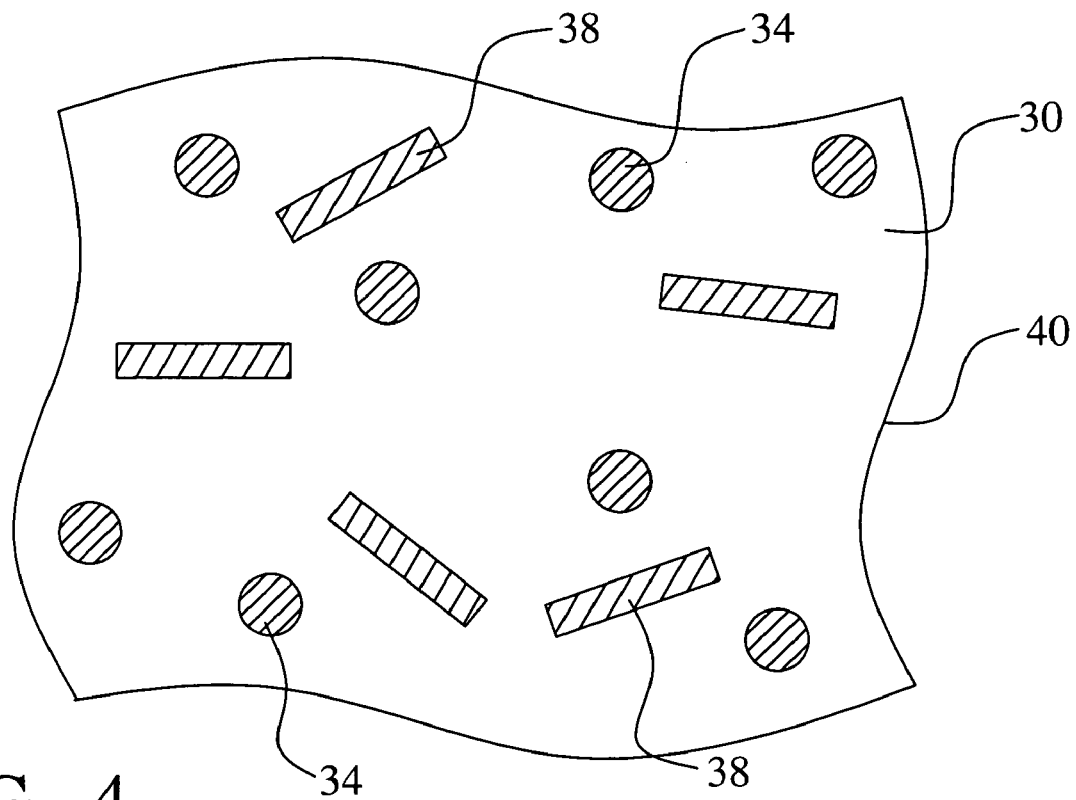
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.20 and 0.40, and is preferably about 0.30. Stainless Steel Fiber of 8–11 micron in diameter and lengths of 4–6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
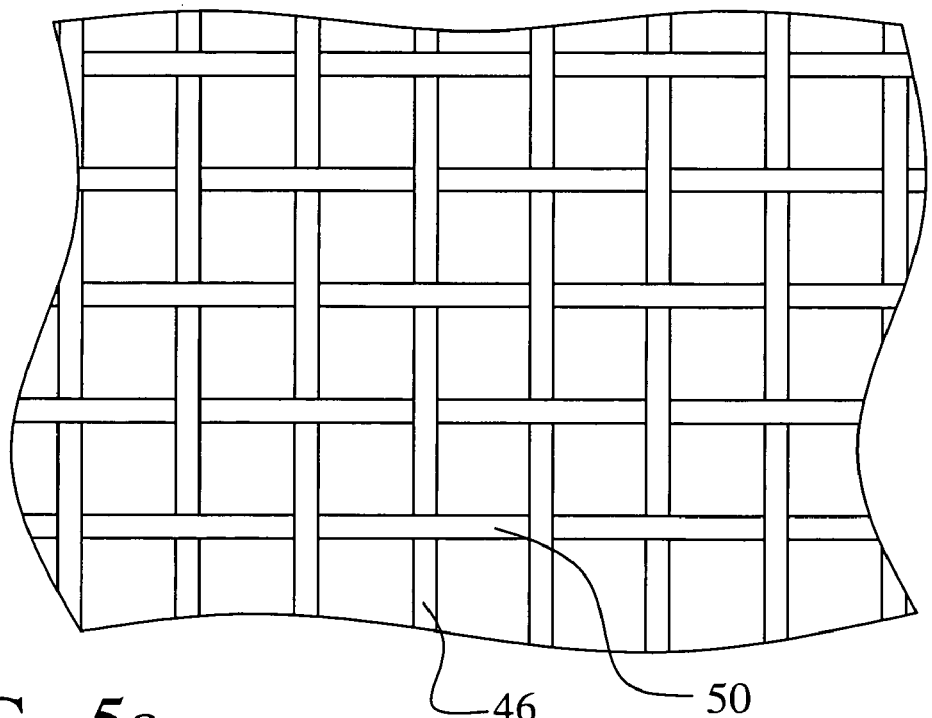
FIGS. 5a and 5b illustrate a fourth preferred embodiment wherein conductive fabric-like materials are formed from the conductive loaded resin-based material.
Figure 5B:
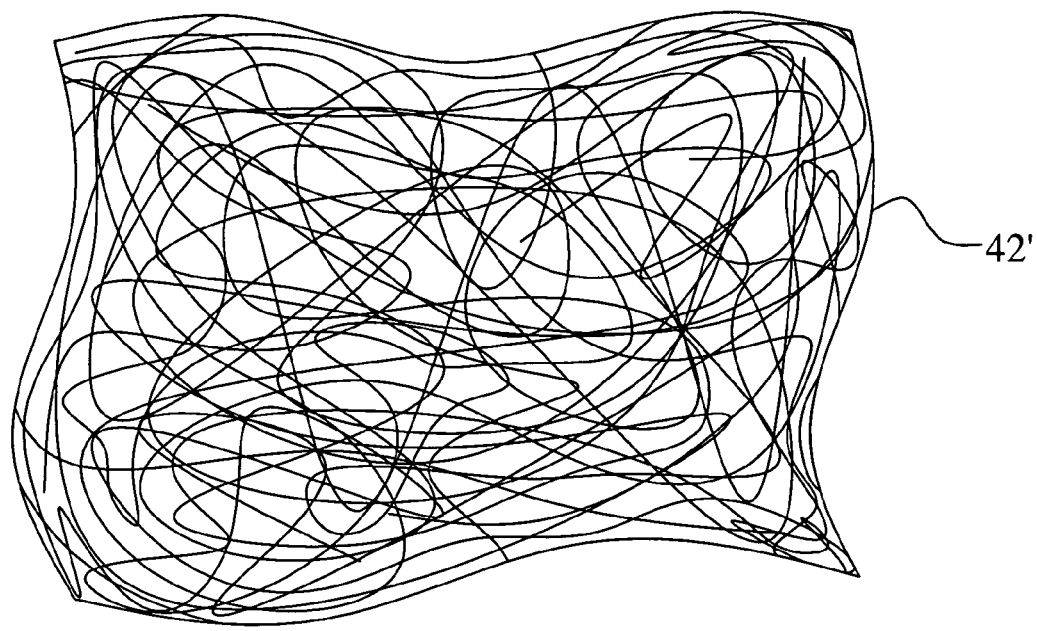

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6:
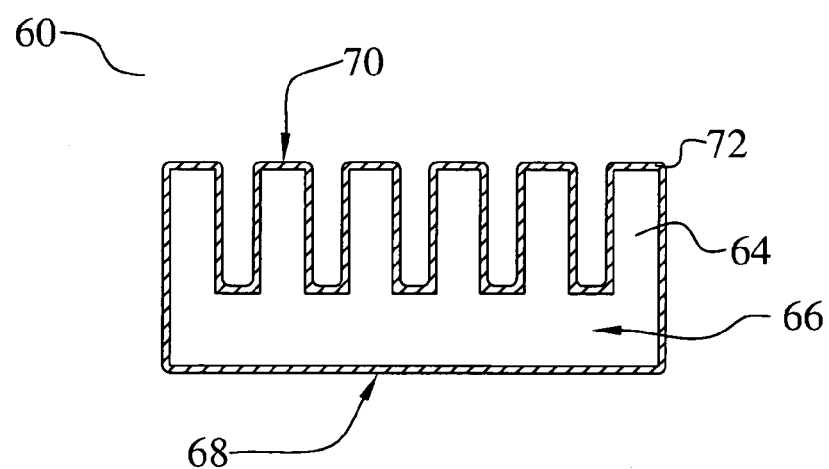
FIG. 6 illustrates a second preferred embodiment of the present invention further showing a conductive loaded resin-based heat sink device having an overlying metal layer.

Referring now to FIG. 6, a second preferred_embodiment of the present invention is illustrated. Here the thermal dissipation device 60 comprises a heat sink 64 fabricated with the conductive loaded, resin-based material. The heat sink 64 again features an attachment surface 68, a convective surface 70, and a bulk region 66 therebetween. As an added feature, a metal layer 72 is formed on the conductive loaded, resin-based heat sink 64. The metal layer 72 may be added to alter the thermal characteristics or the appearance of the composite heat sink. The metal layer 72 may be formed overlying the attachment surface 68 to alter the thermal conductivity characteristics between the heat sink 64 and the thermal generating device, not shown. Alternatively, the metal layer 72 may be formed overlying the convective surface 70 to alter the heat transfer characteristics from the heat sink 64 to the ambient medium through the fins 70. Finally, the metal layer 72 may be formed overlying all of the conductive loaded, resin-based heat sink 64 as shown.

The metal layer 72 may be formed by plating or by coating. If the method of formation is metal plating, then the resin-based structural material of the conductive loaded, resin-based material is one that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer 72 may be formed by, for example, electroplating or physical vapor deposition.

Figure 9:
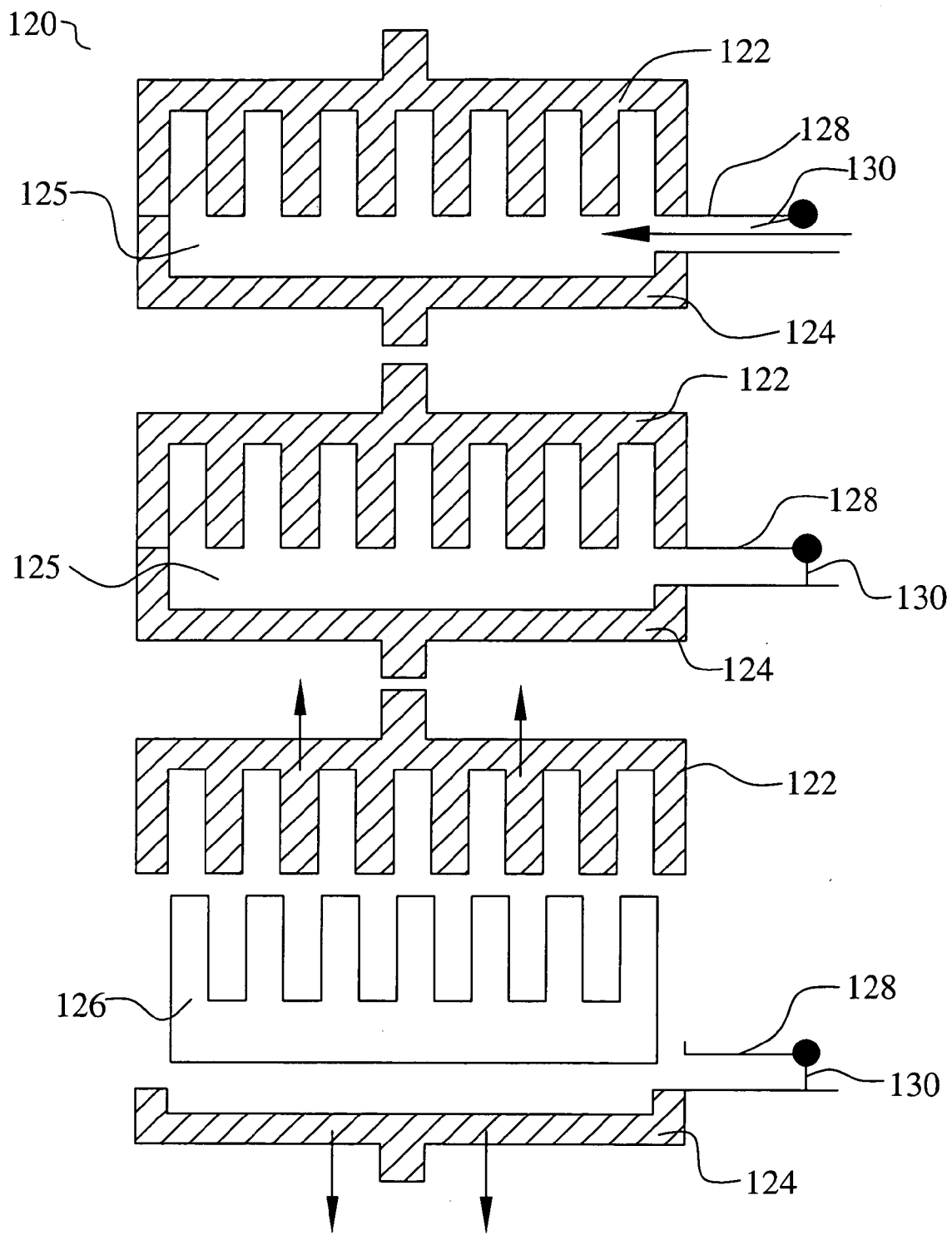
FIG. 9 illustrates a first preferred embodiment of a method to form the conductive loaded resin-based heat sink by injection molding.

The resin-based structural material loaded with micron conductive powders or fibers can be formed into heat sinks in any of several ways. The conductive loaded resin-based materials can be molded, cut, or milled to form a heat sink. Referring now to FIG. 9, as a first preferred method, a simplified schematic diagram of an injection molding sequence 120 for forming a heat sink 126 is shown. The mold comprises an upper portion 122 and a lower portion 124. Conductive loaded blended resin-based material 125 is injected into the mold cavity 125 through an injection opening 128 until the cavity 125 is filled, and then the inlet 128 valve 130 is closed. The homogenized conductive material is then cured by thermal reaction. Finally, the upper portion 122 and the lower portion 124 of the mold are separated and the completed conductive heat sink 126 is removed.

Figure 10:
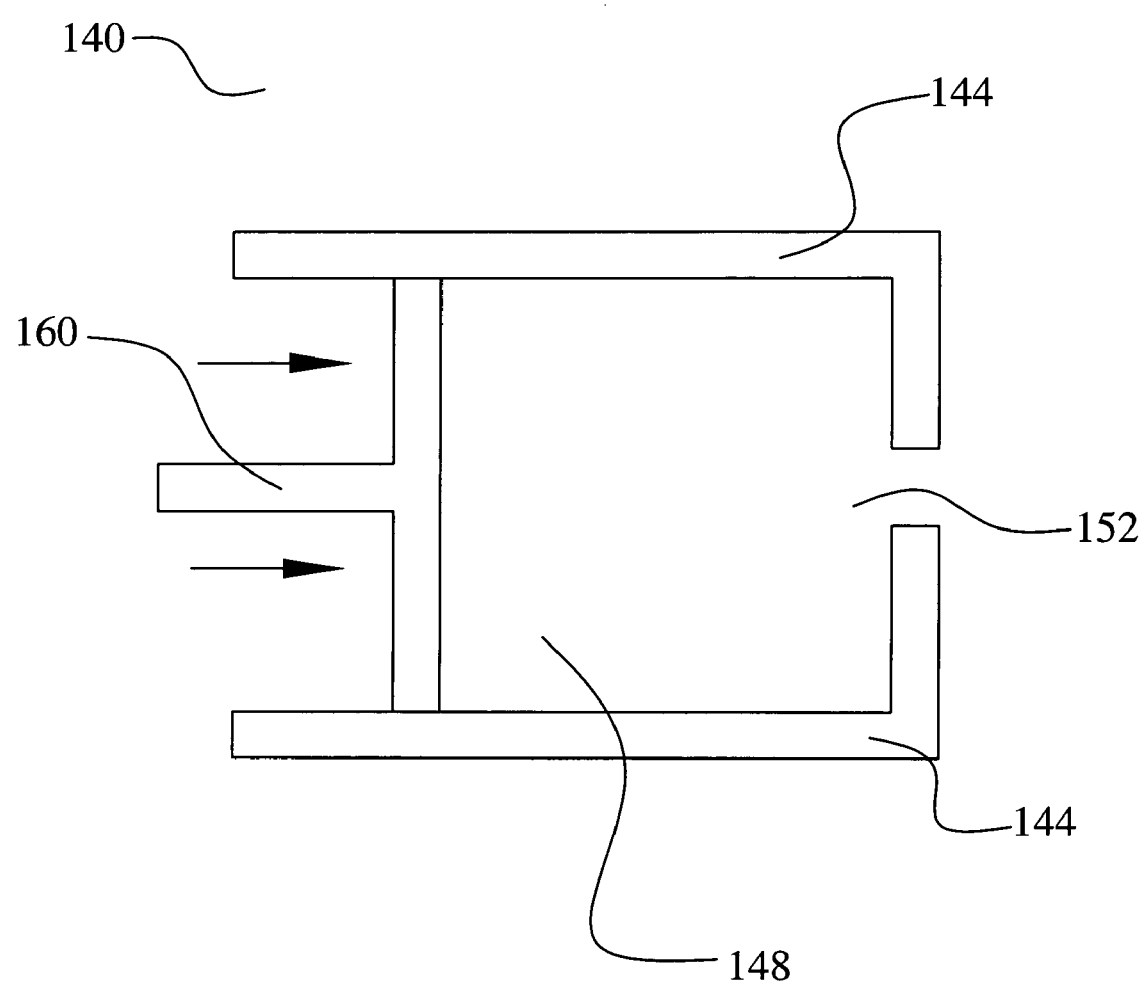
FIG. 10 illustrates a second preferred embodiment of a method to form the conductive loaded resin-based heat sink by extrusion.

Referring now to FIG. 10, a second preferred method 140 of forming the heat sink 166 from the conductive loaded resin-based material is shown. In this case, the heat sink is formed by extrusion. Conductive loaded resin-based material is placed in the hopper 148 of the extrusion unit 140. A piston, screw, press or other means 160 is then used to force the thermally molten or the chemically induced curing conductive loaded resin-based material through an extrusion opening 152 which shapes the thermally molten curing or chemically induced cured conductive loaded resin-based material to the desired shape. The conductive loaded resin-based material is then fully cured by chemical reaction or thermal reaction to a hardened or pliable state and is ready for use. Alternative methods of forming the heat sink device from the conductive loaded, resin-based material include over-molding, lamination, milling, stamping, or cutting. Milling and cutting are performed on conductive loaded resin-based material that is already cured into a block or sheet.

Figure 11:
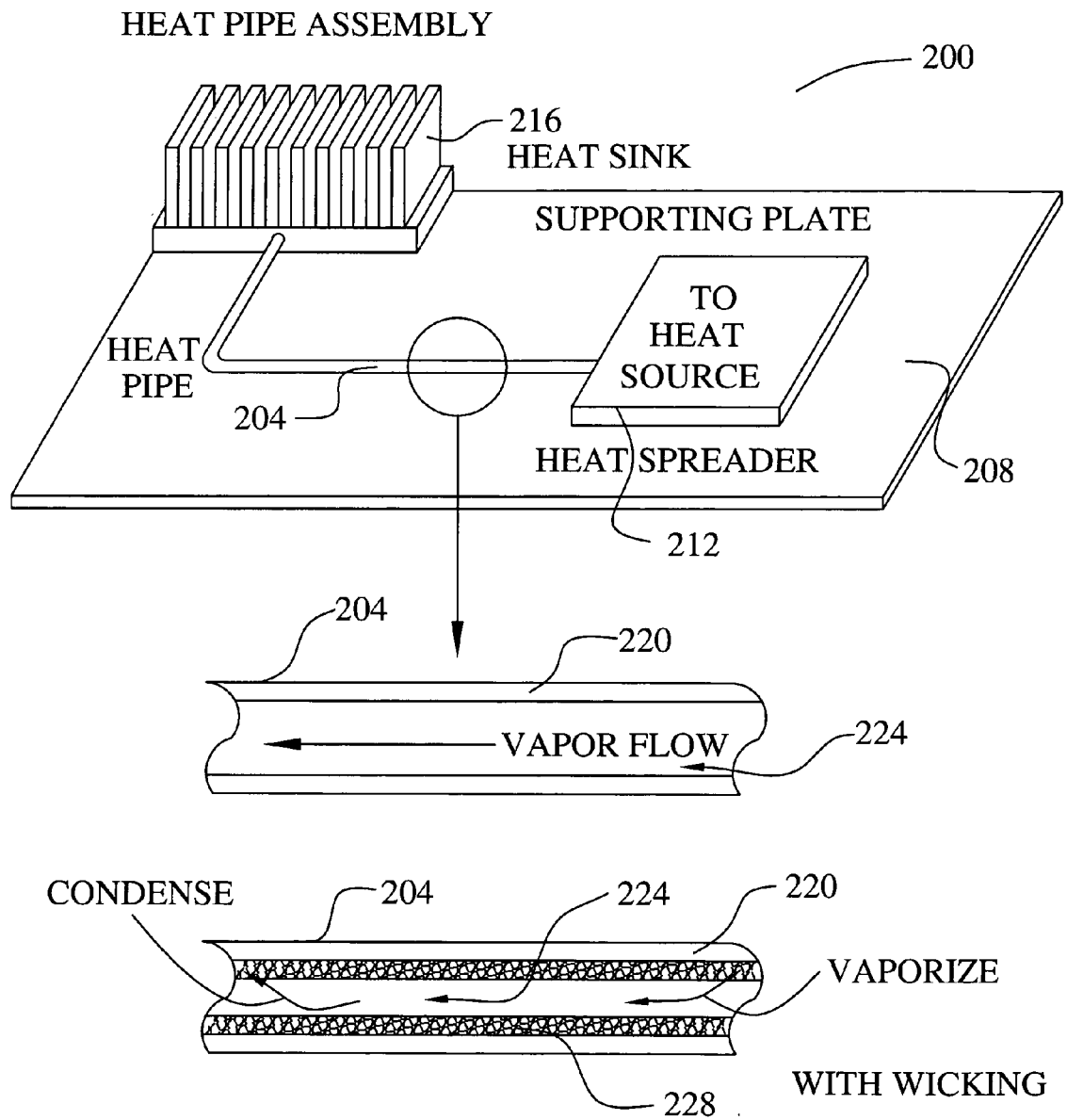
FIG. 11 illustrates a fifth preferred embodiment of the present invention showing a heat pipe molded of conductive loaded resin-based material.

Referring now to FIG. 11 a fifth preferred embodiment of the present invention illustrates a heat pipe 204 molded of conductive loaded resin-based material according to the present invention. In an exemplary heat pipe assembly, as shown, a heat source is thermally coupled to heat spreader 212. A heat pipe 204 is used to conduct heat from the heat spreader 212 to a heat sink 216 where the heat is finally dissipated to the ambient. According to the present invention, the heat spreader 212, heat pipe 204, and heat sink 216 may all be molded of the conductive loaded resin-based material described herein. In particular, the heat pipe comprises an outer conduit 220 of conductive loaded resin-based material. The outer conduit 220 seals in a small amount of a vaporizable liquid, such as glycol, inside 224 the pipe 204. During operation, heat energy from the heat source causes the vaporizable liquid to boil into the vapor state. During the vaporization process, the liquid molecules absorb the latent heat of vaporization from the heat source energy. The vaporized liquid then transports the heat energy away from the heat source and to the heat sink 216. At the heat sink, thermal energy is transferred out of the vaporized liquid and into the heat sink 216 to thereby release the latent heat of vaporization and results in condensation of the liquid. The heat sink 216 then releases this energy to the ambient. Alternatively, the heat pipe may be size appropriately to transfer heat into the ambient without a heat sink or fin mechanism at the condensation end.

The heat pipe 204 allows heat to be routed away from a heat source using a space efficient, small pipe. This technique facilitates the use of thermal generating devices, such as microprocessors or power supplies, in a space-confined area, such as a laptop computer. If the heat pipe 204 is oriented in a vertical manner, then the condensed liquid simply flows down to the heat source end of the heat pipe 204. In other orientations, a wicking layer 228 may be added to the conduit 220. The wicking layer 228 is used to store the small amount of vaporizable liquid in the heat pipe 204. During a thermal event, the vaporized liquid leaves the wicking layer at the heated end. At the cool end of the pipe, the vapor condenses back to liquid and is stored in the wicking 228. If used, the wicking material 228 preferably comprises a sintered powder, a grooved tube, and/or a screen mesh.

Figure 12:
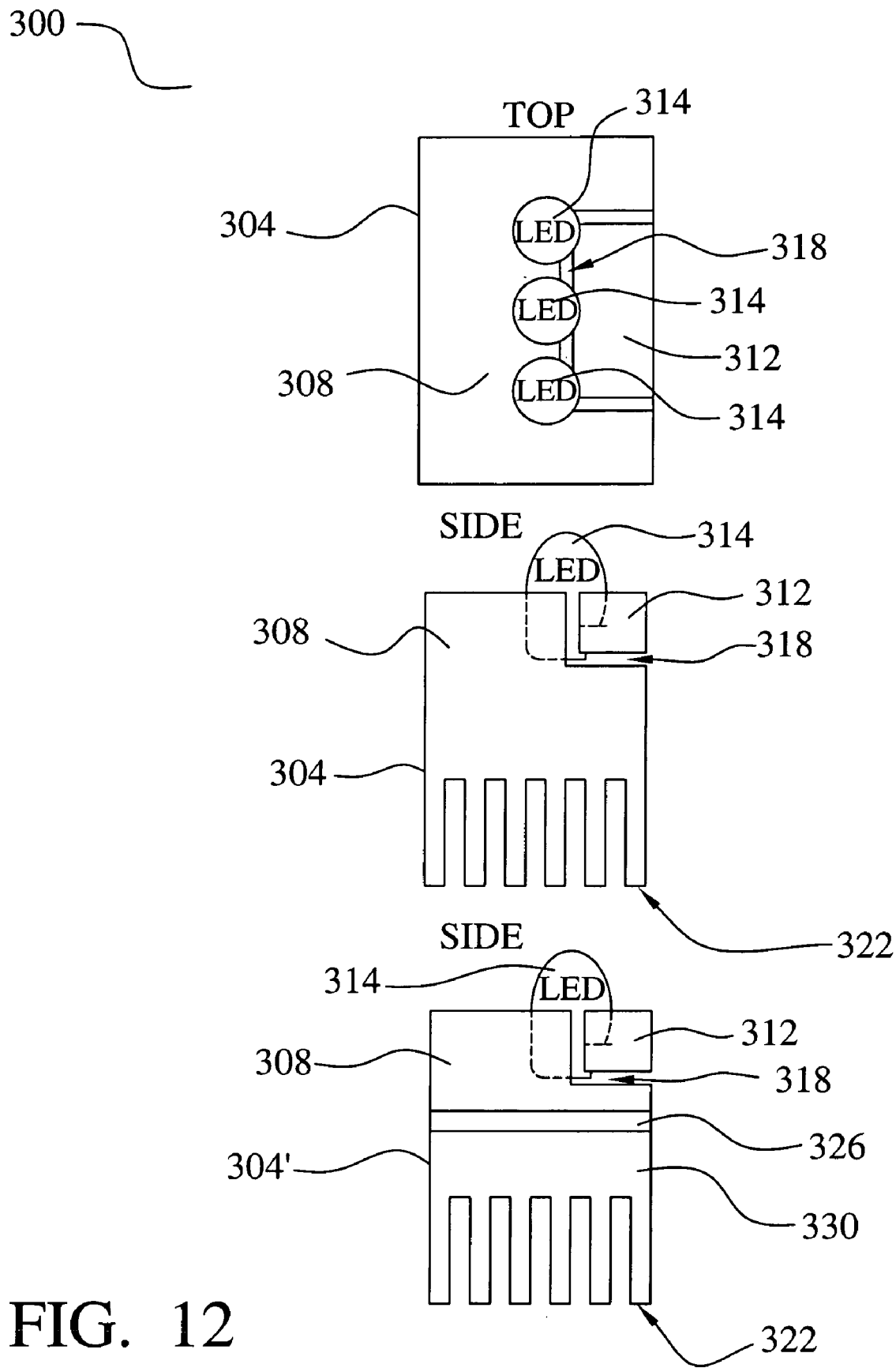
FIG. 12 illustrates a sixth preferred embodiment of the present invention showing a heat sink for an LED.

Referring now to FIG. 12, a sixth preferred embodiment 300 of the present invention is illustrated. In this case, a heat sink 304 for a group of lights 314 and, more particularly, a group of light emitting diode (LED) devices 314 is molded from the conductive loaded resin-based material(s). In the more preferred case, the heat sink section 308, molded of conductive loaded resin-based material, also serves as one electrical terminal for the LED device(s) 314. The second electrical terminal 312 is also molded of conductive loaded resin-based material. In this case, the first terminal 308, the second terminal 312, and the heat sink fins 322 are over-molded onto the LED device(s) 314. In another preferred case 304', the heat sink 330 is electrically isolated from the first terminal 308 and second terminal 312 by an insulating layer 326. However, the insulating layer 326 is thermally conductive. In this case, the first and second terminals, of conductive loaded resin-based material, are first molded onto the LED anode/cathode, then the heat sink 330, of conductive loaded resin-based material, is over-molded onto the LED-terminal subassembly 308, 312, and 314. Either embodiment represents a large cost and weight savings when compared to metal terminal and heat sink systems.

The advantages of the present invention may now be summarized. An effective heat dissipation device is achieved. The heat-dissipating device is formed from a conductive loaded resin-based material to reduce manufacturing and material cost. The heat-dissipating device is formed from a conductive loaded resin-based material where the thermal characteristics of the heat sink can be adjusted by altering the composition of the material. The thermal performance of the heat-dissipating device formed from the conductive loaded resin-based material may be altered by adding a metal layer overlying the heat sink. Methods to fabricate a heat-dissipating device from a conductive loaded resin-based material incorporate various forms of the material. A method to fabricate a heat-dissipating device from a conductive loaded resin-based fabric is achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A heat sink device comprising:
   a bulk region;
   an attachment surface on a first side of said bulk region; and
   a convection surface on a second side of said bulk region wherein said bulk region, attachment surface, and convection surface comprise a conductive loaded, resin-based material comprising micron conductive fiber in a base resin host and wherein said conductive loaded resin-based material is highly conductive.

2. The device according to claim 1 wherein the ratio, by weight, of said micron conductive fiber to said resin host is between about 0.20 and about 0.40.

3. The device according to claim 1 wherein said convective surface comprises a plurality of fins.

4. The device according to claim 1 wherein said conductive loaded resin-based material further comprises metal powder.

5. The device according to claim 4 wherein said metal powder is nickel, copper, silver, or is a material plated with nickel, copper, or silver.

6. The device according to claim 4 wherein said metal powder comprises a diameter of between about 3 $\mu$m and about 12 $\mu$m.

7. The device according to claim 1 wherein said conductive loaded resin-based material further comprises non-metal powder.

8. The device according to claim 7 wherein said non-metal powder is carbon, graphite, or an amine-based material.

9. The device according to claim 1 wherein said conductive loaded resin-based material further comprises a combination of metal powder and non-metal powder.

10. The device according to claim 1 wherein said micron conductive fiber is nickel plated carbon fiber, stainless steel fiber, copper fiber, silver fiber or combinations thereof.

11. The device according to claim 1 wherein said micron conductive fiber pieces each have a diameter of between about 3 $\mu$m and about 12 $\mu$m and a length of between about 2 mm and about 14 mm.

12. The device according to claim 1 further comprising a metal layer coated onto said conductive loaded resin-based material.

13. The device according to claim 1 further comprising a metal layer plated onto said conductive loaded resin-based material.

14. A heat pipe device comprising:
   a conduit comprising a conductive loaded, resin-based material comprising micron conductive fiber in a resin host; and
   a vaporizable liquid sealed inside said conduit.

15. The device according to claim 14 wherein the ratio, by weight, of said micron conductive fiber to said resin host is between about 0.20 and about 0.40.

16. The device according to claim 14 wherein said convective surface comprises a plurality of fins.

17. The device according to claim 14 wherein said conductive loaded resin-based material further comprises metal powder.

18. The device according to claim 17 wherein said metal powder is nickel, copper, silver, or is a material plated with nickel, copper, or silver.

19. The device according to claim 17 wherein said metal powder comprises a diameter of between about 3 µm and about 12 µm.

20. The device according to claim 14 wherein said conductive loaded resin-based material further comprises non-metal powder.

21. The device according to claim 20 wherein said non-metal powder is carbon, graphite, or an amine-based material.

22. The device according to claim 14 wherein said conductive loaded resin-based material further comprises a combination of metal powder and non-metal powder.

23. The device according to claim 14 wherein said micron conductive fiber is nickel plated carbon fiber, stainless steel fiber, copper fiber, silver fiber or combinations thereof.

24. The device according to claim 14 wherein said micron conductive fiber pieces each have a diameter of between about 3 µm and about 12 µm and a length of between about 2 mm and about 14 mm.

25. The device according to claim 14 further comprising a metal layer coated onto said conductive loaded resin-based material.

26. The device according to claim 14 further comprising a metal layer plated onto said conductive loaded resin-based material.

27. The device according to claim 14 further comprising a wicking material inside said conduit wherein said wicking layer is capable of storing said vaporizable liquid in the liquid state.

28. The device according to claim 27 wherein said wicking layer is a sintered powder, a grooved tube, or a wire mesh.

29. An electrical system device comprising:
an electrically powered device; and
a thermal dissipation device comprising a conductive loaded, resin-based material comprising material comprising micron conductive fiber in a base resin host wherein said conductive loaded resin-based material is highly conductive.

30. The system according to claim 29 wherein said thermal dissipation device comprises a heat sink.

31. The system according to claim 29 wherein said thermal dissipation device comprises a heat pipe.

32. The device according to claim 29 wherein conductive loaded resin-based material further comprises a conductive powder.

33. The device according to claim 29 further comprising a metal layer plated onto said conductive loaded resin-based material.

34. The device according to claim 29 further comprising a metal layer coated onto said conductive loaded resin-based material.

35. The device according to claim 29 further comprising a means to force air across said convection surface.

36. The device according to claim 29 further comprising a liquid in direct contact with said convection surface.

37. A method to form a thermal dissipation device, said method comprising:
providing a conductive loaded, resin-based material comprising micron conductive fiber in a base resin host wherein said conductive loaded resin-based material is highly conductive; and
molding said conductive loaded, resin-based material into a thermal dissipation device comprising a heat sink or a heat pipe.

38. The method according to claim 37 wherein the ratio, by weight, of said micron conductive fiber to said resin host is between about 0.20 and about 0.40.

39. The method according to claim 37 wherein said conductive loaded resin-based material further comprises a conductive powder.

40. The method according to claim 37 further comprising a metal layer plated onto said conductive loaded resin-based material.

41. The method according to claim 37 further comprising a metal layer plated onto said conductive loaded resin-based material.

42. A combined light and heat sink device comprising:
a light; and
a first terminal connected to said light;
a second terminal connected to said light; and
a heat sink wherein said first and second terminals and said heat sink comprise a conductive loaded resin-based material comprising micron conductive fiber in a base resin host wherein said conductive loaded resin-based material is highly conductive.

43. The device according to claim 42 wherein said first terminal and said heat sink are a single, homogeneous piece of said conductive loaded resin-based material.

44. The device according to claim 42 wherein the ratio, by weight, of said micron conductive fiber to said resin host is between about 0.20 and about 0.40.

45. The device according to claim 42 wherein said conductive loaded resin-based material further comprises metal powder.

46. The device according to claim 45 wherein said metal powder is nickel, copper, silver, or is a material plated with nickel, copper, or silver.

47. The device according to claim 45 wherein said metal powder comprises a diameter of between about 3 µm and about 12 µm.

48. The device according to claim 42 wherein said conductive loaded resin-based material further comprises non-metal powder.

49. The device according to claim 48 wherein said non-metal powder is carbon, graphite, or an amine-based material.

50. The device according to claim 42 wherein said conductive loaded resin-based material further comprises a combination of metal powder and non-metal powder.

51. The device according to claim 42 further comprising a metal layer plated or coated onto said conductive loaded resin-based material.

52. The device according to claim 42 wherein said micron conductive fiber is nickel plated carbon fiber, stainless steel fiber, copper fiber, silver fiber or combinations thereof.

53. The device according to claim 42 wherein said micron conductive fiber pieces each have a diameter of between about 3 µm and about 12 µm and a length of between about 2 mm and about 14 mm.

* * * * *

(12) EX PARTE REEXAMINATION CERTIFICATE (7756th)
United States Patent
Aisenbrey

(10) Number: US 7,027,304 C1
(45) Certificate Issued: Sep. 21, 2010

(54) LOW COST THERMAL MANAGEMENT DEVICE OR HEAT SINK MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

Reexamination Request:
No. 90/010,283, Dec. 11, 2008

Reexamination Certificate for:
Patent No.: 7,027,304
Issued: Apr. 11, 2006
Appl. No.: 10/807,036
Filed: Mar. 23, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/478,775, filed on Jun. 16, 2003, provisional application No. 60/462,072, filed on Apr. 14, 2003, provisional application No. 60/317,808, filed on Sep. 7, 2001, provisional application No. 60/269,414, filed on Feb. 16, 2001, and provisional application No. 60/268,822, filed on Feb. 15, 2001.

(51) Int. Cl.
*H05K 7/20* (2006.01)

(52) U.S. Cl. .................. 361/704; 361/700; 361/708; 361/709; 165/80.4; 165/104.33; 165/185

(58) Field of Classification Search .................. None
See application file for complete search history.

(56) References Cited

U.S. PATENT DOCUMENTS

| | | | | |
|---|---|---|---|---|
| 4,500,595 A | * | 2/1985 | Gerteisen et al. | 428/298.7 |
| 4,530,779 A | * | 7/1985 | Mayama et al. | 252/507 |
| 4,664,971 A | * | 5/1987 | Soens | 428/372 |
| 4,788,104 A | * | 11/1988 | Adriaensen et al. | 428/298.4 |
| 5,100,726 A | * | 3/1992 | Nakagawa | 428/323 |
| 5,186,862 A | * | 2/1993 | Krijger et al. | 252/512 |
| 6,058,013 A | * | 5/2000 | Christopher et al. | 361/704 |
| 6,109,340 A | * | 8/2000 | Nakase et al. | 165/80.3 |
| 6,139,783 A | * | 10/2000 | McCullough | 264/40.1 |
| 6,237,223 B1 | * | 5/2001 | McCullough | 29/890.032 |
| 6,239,976 B1 | * | 5/2001 | Templeton et al. | 361/737 |
| 6,251,978 B1 | * | 6/2001 | McCullough | 524/404 |
| 6,561,680 B1 | * | 5/2003 | Shih | 362/294 |
| 2001/0025075 A1 | | 9/2001 | Smith et al. | 524/440 |
| 2002/0062950 A1 | | 5/2002 | McCullough et al. | 165/133 |
| 2002/0064024 A1 | | 5/2002 | McCullough et al. | 361/687 |
| 2003/0019103 A1 | | 1/2003 | Sagal et al. | 29/890.03 |

* cited by examiner

*Primary Examiner* — Tuan H Nguyen

(57) ABSTRACT

Heat sinks, heat pipes, and other thermal management devices are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

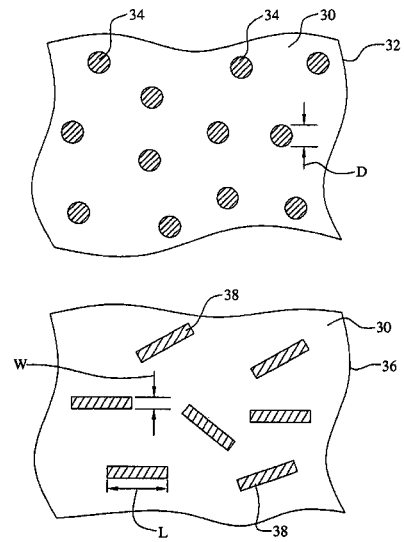

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 4-9, 17-22, 32, 39, and 45-50 are cancelled.

Claims 1, 11, 14, 24, 29, 37, 42 and 53 are determined to be patentable as amended.

Claims 2, 3, 10, 12, 13, 15, 16, 23, 25-28, 30, 31, 33-36, 38, 40, 41, 43, 44, 51, and 52, dependent on an amended claim, are determined to be patentable.

1. A heat sink device comprising:
   a bulk region;
   an attachment surface on a first side of said bulk region;
   and a convection surface on a second side of said bulk region wherein said bulk region, attachment surface, and convection surface comprise a conductive loaded, resin-based material [comprising] *consisting essential of* micron conductive fiber in a base resin host *wherein said micron conductive fiber has diameter between 3 µm and 12 µm and* wherein said conductive loaded resin-based material is highly conductive.

11. The device according to claim 1 wherein said micron conductive fiber pieces each have [a diameter of between about 3 µm and about 12 µm and] a length of between about 2 mm and about 14 mm.

14. A heat pipe device comprising:
   a conduit comprising a conductive loaded, resin-based material [comprising] *consisting essentially of* micron conductive fiber *wherein said micron conductive fiber has diameter between 3 µm and 12 µm* in a resin host;
   and a vaporizable liquid sealed inside said conduit.

24. The device according to claim 14 wherein said micron conductive fiber pieces each have [a diameter of between about 3 µm and about 12 µm and] a length of between about 2 mm and about 14 mm.

29. An electrical system device *comprising*:
   an electrically powered device;
   and a thermal dissipation device comprising a conductive loaded, resin-based material comprising material [comprising] *consisting essentially of* micron conductive fiber in a base resin host *wherein said micron conductive fiber has diameter between 3 µm and 12 µm and* wherein said conductive loaded resin-based material is highly conductive.

37. A method to form a thermal dissipation device, said method comprising:
   providing a conductive loaded, resin-based material [comprising] *consisting essentially of* mircon conductive fiber in a base resin host *wherein said mircon conductive fiber has diameter between 3 µm and 12 µm and* wherein said conductive loaded resin-based material is highly conductive; and molding said conductive loaded, resin-based material into a thermal dissipation device comprising a heat sink or a heat pipe.

42. A combined light and heat sink device comprising:
   a light;
   and a first terminal connected to said light;
   a second terminal connected to said light;
   and a heat sink wherein said first and second terminals and said heat sink comprise a conductive loaded resin-based material [comprising] *consisting essentially of* micron conductive fiber in a base resin host *wherein said micron conductive fiber had diameter between 3 µm and 12 µm and* wherein said conductive loaded resin-based material is highly conductive.

53. The device according to claim 42 wherein said micron conductive fiber pieces each have [a diameter of between about 3 µm and about 12 µm and] a length of between 2 mm and about 14 mm.

* * * * *